(12) United States Patent
Dedic et al.

(10) Patent No.: US 10,333,464 B2
(45) Date of Patent: Jun. 25, 2019

(54) INTEGRATED CIRCUITRY

(71) Applicant: SOCIONEXT INC., Yokohama-shi, Kanagawa (JP)

(72) Inventors: Ian Juso Dedic, Northolt (GB); Abdullah Mohd. Riazuddin Ahmed, Maidenhead (GB)

(73) Assignee: SOCIONEXT INC., Yokohama (JP)

( * ) Notice: Subject to any disclaimer, the term of this patent is extended or adjusted under 35 U.S.C. 154(b) by 154 days.

(21) Appl. No.: 15/456,277

(22) Filed: Mar. 10, 2017

(65) Prior Publication Data
US 2017/0264240 A1   Sep. 14, 2017

(30) Foreign Application Priority Data
Mar. 11, 2016  (EP) .................... 16160040

(51) Int. Cl.
G06F 1/10      (2006.01)
G06F 3/05      (2006.01)
H03B 5/12      (2006.01)
H01L 29/94     (2006.01)
H03B 27/00     (2006.01)
H03K 5/135     (2006.01)

(52) U.S. Cl.
CPC ............ *H03B 5/1256* (2013.01); *G06F 1/10* (2013.01); *G06F 3/05* (2013.01); *H01L 29/94* (2013.01); *H03B 5/1293* (2013.01); *H03B 27/00* (2013.01); *H03K 5/135* (2013.01)

(58) Field of Classification Search
CPC .............................. H03B 5/1256; H03K 5/135
See application file for complete search history.

(56) References Cited

U.S. PATENT DOCUMENTS

| 7,075,365 | B1 | 7/2006 | Starr et al. |
| 8,704,576 | B1 | 4/2014 | Bucelot et al. |
| 2006/0053395 | A1 | 3/2006 | Lai et al. |
| 2011/0096447 | A1* | 4/2011 | Higuchi ............ H01L 27/0255 361/56 |
| 2014/0055180 | A1 | 2/2014 | Garg et al. |

FOREIGN PATENT DOCUMENTS

| EP | 2 211 468 A1 | 7/2010 |
| EP | 2 849 345 A1 | 3/2015 |
| WO | WO 2011/025557 A1 | 3/2011 |

OTHER PUBLICATIONS

Extended European Search Report of related European Patent Application No. 16160040.8 dated Dec. 19, 2016.
Partial European Search Report of related European Patent Application No. 16160040.8 dated Sep. 19, 2016.

\* cited by examiner

*Primary Examiner* — Jeffrey M Shin
(74) *Attorney, Agent, or Firm* — Arent Fox LLP

(57) ABSTRACT

There is disclosed herein integrated circuitry comprising a clock path for carrying a clock signal from a clock source to a circuit block, the circuit block being operable based on the clock signal. Clock buffer circuitry is provided along the clock path for buffering the clock signal. A tuneable inductance is connected to the clock path. A capacitor is connected to the clock path so as to form an AC coupling capacitor connected in series along the path, and is implemented between metal layers of the integrated circuitry.

13 Claims, 10 Drawing Sheets

| COMBINATION | INDUCTORS EMPLOYED |
|---|---|
| 1 | L1 |
| 2 | L2 |
| 3 | L3 |
| 4 | L4 |
| 5 | L1 + L2 |
| 6 | L2 + L3 |
| 7 | L3 + L4 |
| 8 | L1 + L2 + L3 |
| 9 | L2 + L3 + L4 |
| 10 | L1 + L2 + L3 + L4 |

FIG. 5

INTEGRATED CIRCUITRY

CROSS-REFERENCE TO RELATED APPLICATIONS

This application claims priority to European Patent Application No. 16160040.8, filed Mar. 11, 2016. The disclosure of the priority application is incorporated in its entirety herein by reference.

The present invention relates to integrated circuitry, and in particular to integrated circuitry comprising elements or blocks operable based on a clock signal. In such circuitry, one or more clock paths distribute a clock signal from a clock source to the elements or blocks requiring that signal.

A challenge in such circuitry is to make it suitable for different applications and at the same time efficient in terms of circuit area, power consumption, and design time. For example, although it would be possible to create several versions of a circuit specific to particular applications, either on the same IC chip or by way of several different IC chips, this would require additional resource in terms of chip design and potentially lead to inefficiencies both in terms of circuit area and power consumption.

It is desirable to provide integrated circuitry which addresses such challenges.

According to an embodiment of a first aspect of the present invention there is provided integrated circuitry, comprising a clock path for carrying a clock signal (or other similar repetitive signal) from a clock source to a circuit block, the circuit block being operable based on said clock signal; clock buffer circuitry provided along said clock path for buffering said clock signal; and a tuneable inductance connected to said clock path.

Such circuitry may advantageously enable resonant operation to be achieved over a range of different operating (clock) frequencies, rendering the circuitry suitable for use for a range of different applications which require different operating frequencies.

Such integrated circuitry may be provided by way of an IC chip or set of chips, or a part thereof. Although focus here is placed on clock signals and clock paths, other types of signal may be equally relevant such as control signals. The associated features (e.g. clock buffer circuitry) will be understood accordingly (e.g. as signal buffer circuitry). Such signals may be switched logic level signals, such as digital signals, or analogue signals such as substantially sinusoidal signals. The signals may be AC, repeating, signals. The circuit block may be any circuit block operable based on such a signal. Examples include digital-to-analogue converter (DAC) circuit blocks, analogue-to-digital converter (ADC) circuit blocks, and digital circuit blocks in general.

The clock buffer circuitry may be any form of signal buffering circuitry, for example useful for driving a load such as the circuit block with the buffered signal. The tuneable inductance may be an input-signal-controlled inductor such as a variable inductor, controllable by way of an input signal such as an analogue voltage signal or a digital signal.

The tuneable inductance may comprise an array of inductors and switching circuitry configured to switch the inductors into or out of circuit based upon a control signal. The inductors of the array may be connected together in parallel, however each such inductor may be implemented as two or more inductors connected together in series. The switching circuitry may comprise switches such as transistors, for example connected in the series path of such series-connected transistors. Such transistors may be connected in series with corresponding inductors of a parallel array of inductors. Thus, controlling the switches may control which of the inductors are switched into or out of circuit in the array. Digital signals could control such switches.

The inductors of the array may have mutually different inductance values. For example, where the array is an array of parallel-connected inductors, the parallel-connected inductors may have mutually different inductance values. It will be appreciated that each such parallel-connected inductor may itself be formed from multiple inductors, which themselves may be connected together in series or parallel.

The array may have N inductors $L_1$ to $L_N$, where N is an integer greater than 1. Those N inductors may be connected together in parallel. The inductors may have respective inductance values $L_1$ to $L_N$. Those N inductors may be connected together in parallel, but may be made up of networks of inductors. The inductance values $L_1$ to $L_N$ may be set such that different combinations of those inductors provide a range of different overall inductance values of the tuneable inductance, each combination comprising at least one of those inductors switched into circuit and up to N−1 of those inductors switched out of circuit.

The inductance values $L_1$ to $L_N$ may be such that combinations of the inductors $L_1$ to $L_N$ provide predetermined or "designed" overall inductance values, or such that combinations of the inductors $L_1$ to $L_N$ provide a range of overall inductance values.

For example, the range of different overall inductance values may include a maximum overall inductance value $L_{MAX}$ and a minimum overall inductance value $L_{MIN}$. The inductance values $L_1$ to $L_N$ may be set such that $L_{MAX}/L_{MIN}$ is greater than 4 or 5 or 6 or 7 or 10, depending on the required tuning range. For example, if the desired LC tuning range is 2:1 (so any frequency can be covered after division) the required inductor range is 4:1. In practice, to allow for variations in circuit values, at least 5:1 would be desirable in this case.

The inductance values $L_1$ to $L_N$ may be set such that the different overall inductance values are evenly or relatively evenly distributed from $L_{MAX}$ to $L_{MIN}$. For example, when N=4, the inductance values $L_1$ to $L_N$ may be set such that the values $L_1-L_2$, $L_2-L_3$, and $L_3-L_4$ are between $0.1L_1$ and $0.2L_1$. Example relative values could be $L_1$=1.0, $L_2$=0.8, $L_3$=0.63, $L_4$=0.5, this meaning for example that $L_4$ is half the size of $L_1$.

The inductors of the array may be, or be made up of networks of, discrete inductors. The inductors of the array may be connected together in parallel.

The tuneable inductance may form part of the clock buffer circuitry or be provided separately from the clock buffer circuitry.

The integrated circuitry may comprise a tuneable clock source, such as a voltage-controlled oscillator (VCO), configured to generate the clock signal. The integrated circuitry may also comprise control circuitry operable to control the tuneable clock source such that the clock signal has a desired or target clock frequency and to control the tuneable inductance (e.g. with control signals L1 to LN corresponding respectively to inductors $L_1$ to $L_N$) such that its inductance value corresponds to the clock frequency. The inductance value of the tuneable inductance may be considered to correspond to the clock frequency if it brings the resonant frequency of the circuitry concerned to or towards or close to the clock frequency, or causes resonant or near-resonant transmission of the clock signal to the circuit block.

The tuneable clock source may comprise a plurality of tuneable clock-signal generators, each configured to generate a clock signal having a clock frequency over its own frequency range, and circuitry for selecting and outputting the clock signal generated by one of those clock-signal generators.

The integrated circuitry may comprise a plurality of groups of such clock paths, sets of buffer circuitry and tuneable inductances. Each group may be configured in the same way. Such groups may carry respective clock signals of a set of e.g. quadrature clock signals. The circuit block may be common to those groups.

There may be provided clock buffer circuitry, comprising a tuneable inductance as described above. Such clock buffer circuitry may be provided in the form of integrated circuitry. The present disclosure will be interpreted accordingly.

According to an embodiment of a second aspect of the present invention there is provided integrated circuitry, comprising a clock path for carrying a clock signal from a clock source to a circuit block, the circuit block being operable based on the clock signal; and an AC coupling capacitor connected in series along the clock path, wherein: the integrated circuitry has a layered structure comprising a plurality of metal layers and one or more via layers sandwiched between adjacent such metal layers; the clock path is implemented in at least one of the metal layers; and the AC coupling capacitor is implemented in a via layer.

Such circuitry may advantageously enable such clock paths (e.g. where a plurality are provided) to be arranged in an area-efficient manner, and with the layout of such clock paths being substantially the same even for different values of the AC coupling capacitor. This can enable reuse of circuit layouts, leading to design efficiencies. Additionally, such circuitry can help avoid parasitic-capacitance-to-ground associated with the AC coupling capacitor.

As above, such integrated circuitry may be provided by way of an IC chip or set of chips, or a part thereof. Although focus here is placed on clock signals and clock paths, other types of signal may be equally relevant such as control signals. The associated features (e.g. clock path) will be understood accordingly (e.g. as a signal path). Such signals may be switched logic level signals, such as digital signals, or analogue signals such as substantially sinusoidal signals. The signals may be AC, repeating, signals. The circuit block may be any circuit block operable based on such a signal. Examples include digital-to-analogue converter (DAC) circuit blocks, analogue-to-digital converter (ADC) circuit blocks, and digital circuit blocks in general.

It will be appreciated that in such a layer or layered structure, signal paths and/or voltage reference planes may be implemented in the metal layers and connections between the metal layers may be made by way of vias formed in the via layers.

The clock path may be implemented across adjacent metal layers. The AC coupling capacitor may be implemented in a via layer between two adjacent metal layers. The AC coupling capacitor may be implemented in a via layer between two adjacent metal layers across which the clock path is implemented.

The clock path may implemented in a single said metal layer. The AC coupling capacitor may be implemented in a via layer adjacent to that metal layer.

The AC coupling capacitor may comprise a dielectric sandwiched between outer plates. The dielectric outer plates may be implemented in the same via layer. The AC coupling capacitor may be a metal-insulator-metal capacitor. The AC coupling capacitor may be made up of a network of such capacitors.

The layer structure may comprise a substrate layer on which the other layers are formed. The AC coupling capacitor may be vertically shielded from the substrate by one or more of the metal layers. The AC coupling capacitor may underlie or overlie part of the clock path so as not to take up additional area (when the layer structure is viewed in plan view, down through the layers to the substrate) either side of the clock path in the layer structure, i.e. so as to make effective use of the area already taken up by the clock path.

The clock path may be implemented as one or more transmission lines implemented in at least one metal layer.

The AC coupling capacitor may comprise a plurality of capacitors connected together, in series or parallel. The AC coupling capacitor may be distributed along a length of the clock path.

Portions of the clock path may be implemented alongside (over or under) one another in an overlapped configuration, for example in adjacent or different metal layers. As such, the overlapped portions may share the same area when the layer structure is viewed in plan view, down through the layers to the substrate. The AC coupling capacitor may be provided between the overlapped portions. The AC coupling capacitor may be distributed along a length of the overlapped portions.

According to an embodiment of a third aspect of the present invention there is provided integrated circuitry, comprising a signal (clock) path implemented in at least one of a plurality of metal layers of the circuitry; and a capacitor implemented between the metal layers, and connected to the signal path so as to form an AC coupling capacitor connected in series along the path.

The integrated circuitry of any or all of the aforementioned aspects of the present invention may be provided in combination as a fourth aspect of the present invention.

For example, there may be provided integrated circuitry, comprising: a clock path for carrying a clock signal from a clock source to a circuit block, the circuit block being operable based on said clock signal; clock buffer circuitry provided along said clock path for buffering said clock signal; an AC coupling capacitor connected in series along the clock path; and a tuneable inductance connected to said clock path, wherein: the integrated circuitry has a layered structure comprising a plurality of metal layers and one or more via layers sandwiched between adjacent said metal layers; the clock path is implemented in at least one of said metal layers; and the AC coupling capacitor is implemented in a said via layer.

The integrated circuitry may have a plurality of such clock paths. Those paths may have respective such AC coupling capacitors connected therealong in series. Such clock paths may be arranged alongside one another (i.e. side-by-side, when the layer structure is viewed in plan view, down through the layers to the substrate) in a parallel array. The AC coupling capacitors and/or the tuneable inductances may be connected in the same way for each clock path.

According to an embodiment of a fifth aspect of the present invention there is provided digital-to-analogue converter circuitry or analogue-to-digital converter circuitry, comprising the integrated circuitry of any of the aforementioned aspects of the present invention.

According to an embodiment of a sixth aspect of the present invention there is provided an IC chip comprising the integrated circuitry of any of the aforementioned first to fourth aspects of the present invention, or the digital-to-analogue converter circuitry or analogue-to-digital converter circuitry of the aforementioned fifth aspect of the present invention.

The present disclosure extends to method aspects corresponding in scope with the apparatus aspects, and will be understood accordingly.

Reference will now be made, by way of example only, to the accompanying drawings, of which:

FIG. 5 is a table presenting inductor combinations;

Figure 1:
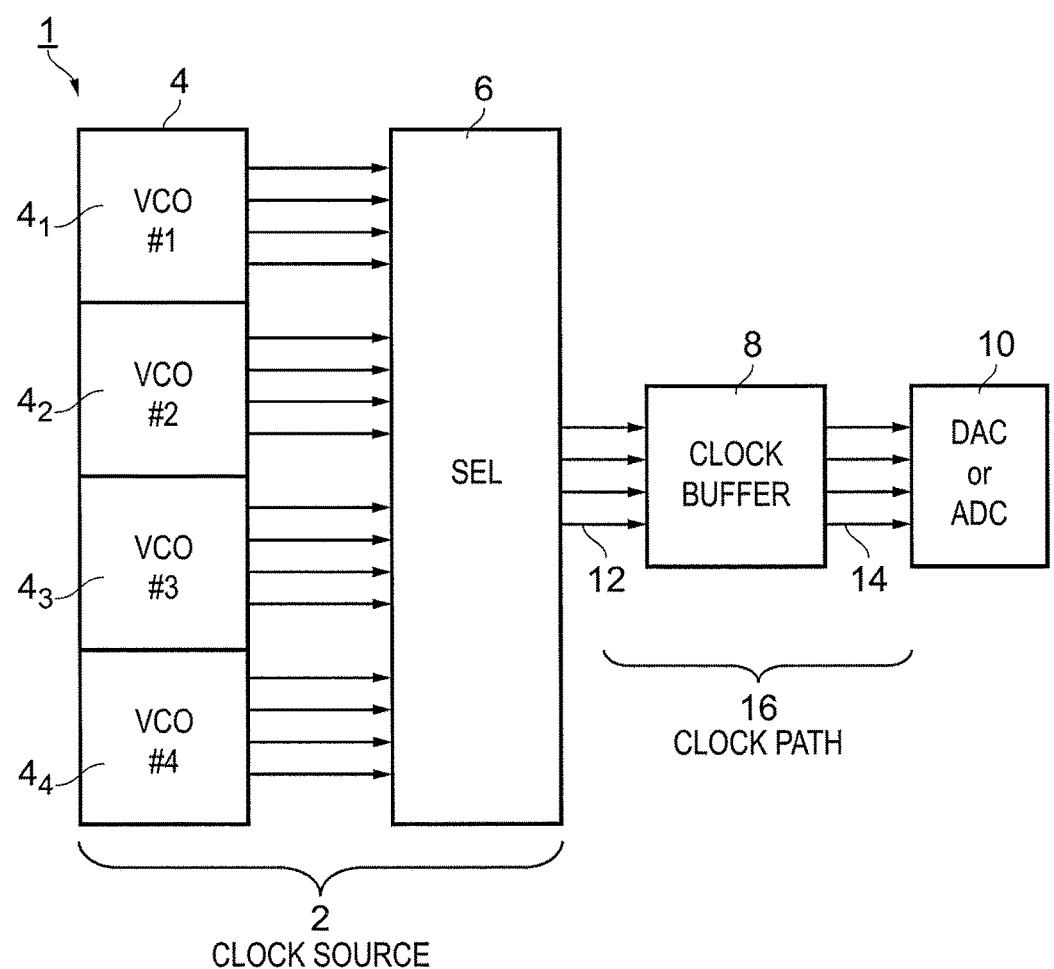
FIG. 1 is a schematic diagram of integrated circuitry in which embodiments of the present invention may be employed.

FIG. 1 is a schematic diagram of integrated circuitry 1 in which embodiments of the present invention may be deployed. Integrated circuitry 1 comprises a clock source 2, a clock buffer 8 and a circuit block 10.

Clock source 2 comprises a voltage-controlled oscillator (VCO) unit 4 and a selector 6, the VCO unit 4 comprising separate VCO units or circuits $4_1$, $4_2$, $4_3$, and $4_4$. In the present arrangement, each of the VCO units $4_1$, $4_2$, $4_3$, and $4_4$ is configured to output a set of quadrature clock signals. For example, such a set of quadrature clock signals may comprise four separate time-interleaved sinusoidal clock signals, having relative phases 0°, 90°, 180° and 270°. Of course, the use of quadrature clock signals as in the present running example is only one example; each VCO unit $4_1$, $4_2$, $4_3$ and $4_4$ could instead output a single clock signal or any group of clock signals.

In the present arrangement, each of the VCO units $4_1$, $4_2$, $4_3$, and $4_4$ is configured to output its clock signals with their clock frequencies tuneable to a desired clock frequency within a given or predetermined frequency range, and with the frequency ranges for the VCO units $4_1$, $4_2$, $4_3$, and $4_4$ being different from one another so that together they cover a larger overall frequency range than the frequency range of any one of them. To this end, the frequency ranges of the VCO units $4_1$, $4_2$, $4_3$, and $4_4$ may together cover the overall frequency range, for example with some overlap between the frequency ranges of the VCO units $4_1$, $4_2$, $4_3$, and $4_4$ which are adjacent in frequency.

As another example, the frequency ranges of the individual VCO units $4_1$, $4_2$, $4_3$, and $4_4$ may cover distinct bands of the overall frequency range, for example where it is known that those distinct bands are of particular interest, with gaps between those bands such that only portions of the overall frequency band or range are covered.

Accordingly, dependent on the desired clock frequency, one of the VCO units $4_1$, $4_2$, $4_3$, and $4_4$ may be selected to output its clock signals at that frequency, with those clock signals being delivered to the clock buffer 8 via the selector 6.

Thus, the selector 6 may be configured to select the clock signals from one of the VCO units $4_1$, $4_2$, $4_3$, and $4_4$ dependent on the desired clock signal. Control circuitry (not shown) may therefore be provided, based on a control signal, to select which VCO unit $4_1$, $4_2$, $4_3$, and $4_4$ outputs clock signals (e.g. deactivating the other VCO units to save power), control the clock frequency of those clock signals within the frequency range or band of the selected VCO unit, and cause the selector 6 to output those clock signals to the clock buffer 8. In this sense, the selector 6 may be referred to as a router or in some respects as a multiplexer (in that it can control which of many possible inputs appear at an output).

The clock buffer 8 is configured to receive the clock signals output from the clock source 2, or more particularly from the selector 6, to buffer those clock signals and to provide those clock signals to the circuit block 10.

As indicated in FIG. 1, the circuit block 10 may be a digital-to-analogue converter (DAC) or an analogue-to-digital converter (ADC) circuit block, operable based on the supplied clock signals. Example such DAC blocks, operable based on such quadrature clock signals, are described in detail in EP2849345, the entire contents of which are hereby incorporated by reference. See for example FIGS. 8 and 9 of that document. Example such ADC blocks, also operable based on such quadrature clock signals, are described in detail in EP2211468, the entire contents of which are also hereby incorporated by reference. See for example FIGS. 10 and 11 of that document.

Signal lines 12 upstream of the clock buffer 8, along with the signal lines 14 downstream of the clock buffer 8 and the clock buffer 8 itself may be referred to as a clock path 16 (assuming that the elements upstream are considered as clock source 2). Indeed, any one such signal line passing via the clock buffer 8 may be referred to as a clock path 16, i.e., the path for carrying a single one of the quadrature clock signals. Such signal lines 12 and 14 may be implemented as transmission lines, as indeed may the signal lines between the VCO unit 4 and the selector 6.

Figure 2:
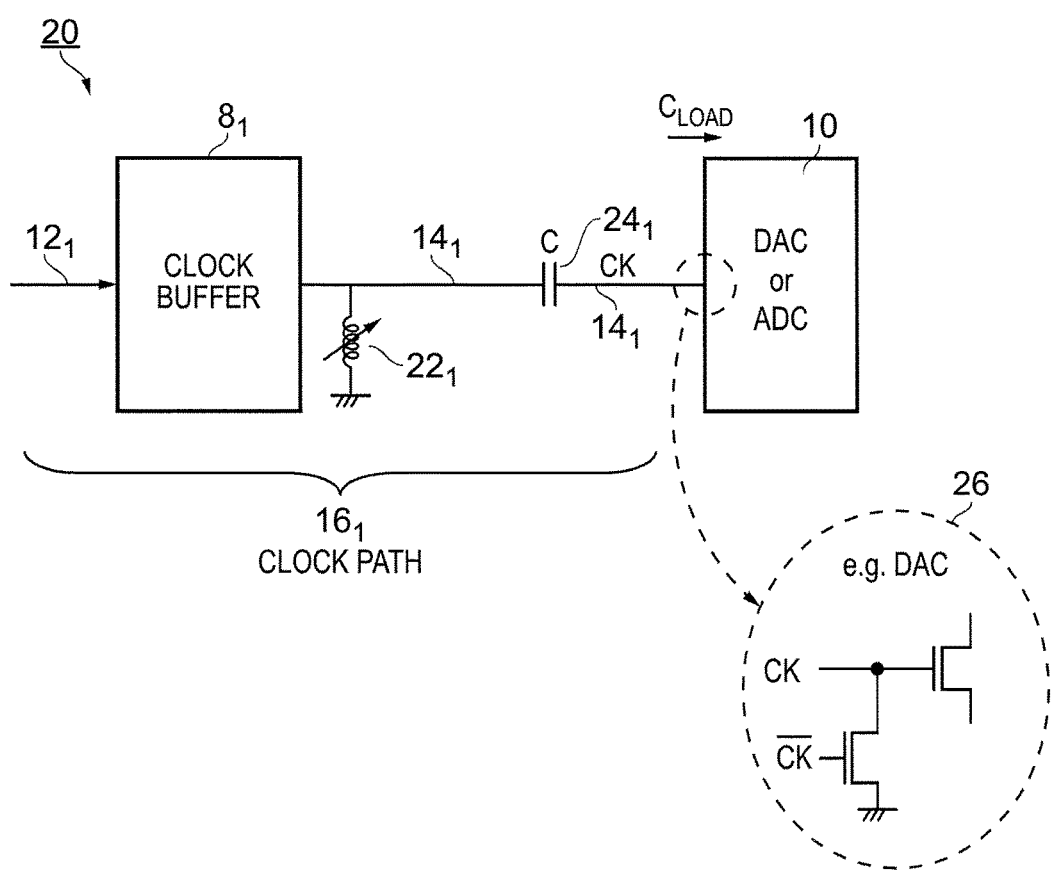
FIG. 2 is a schematic diagram of circuitry corresponding to a clock path of the FIG. 1 circuitry.

FIG. 2 is a schematic diagram of circuitry 20, showing elements of a clock path 16 in more detail. In this case, the circuitry 20 is for a clock path 16 for carrying a single clock signal. To indicate this, the signal lines 12 and 14 and the clock buffer 8 are denoted with a subscript "1" along with the clock path 16 (i.e. respectively $12_1$, $14_1$, $8_1$ and $16_1$) to indicate that they correspond to one of the four component clock signals of the quadrature clock signal set. It will be understood that the other clock signals of the quadrature clock signal set may, perhaps preferably, be conveyed to the circuit block 10 in a similar or the same manner. For simplicity of description, however, the various circuitry elements will be described here generally without indicating (e.g. with a subscript 1) the particular path unless appropriate for a better understanding of embodiments disclosed herein. This disclosure will be considered accordingly.

Circuit 20 comprises, in addition to the elements already described, a variable (or tuneable, or input-signal-controlled) inductor 22 and a capacitor 24. The variable inductor 22 is shown connected along the clock path 16, and may be connected either to a voltage-reference supply such as ground or VDD or between two adjacent such clock paths, e.g. between clock path $16_1$ and another such clock path $16_2$. The capacitor 24 is connected in series along the clock path 16 such that the clock signal as input to the circuit block 10 is AC-coupled to (or DC-decoupled from) the clock signal actually output from the clock buffer 8. In some embodiments, the variable inductor 22 may be considered part of the clock buffer 8 even though in other embodiments it may be (as shown) separate from and external to that buffer 8.

The present inventors have considered the relationship between the resonant frequency $f_0$ and the effective LC components associated with the clock buffer 8 and the input of the circuit block 10 (DAC or ADC), i.e. $f_0=1/(2\pi(\sqrt{LC}))$. In order to drive the clock buffer 8 at maximum gain and efficiency (minimising loss), it is desirable to tune the LC components to align the resonant frequency with the selected operating frequency (i.e., the frequency of the clock signal) as far as possible. The inventors have determined that adding a large amount of additional capacitance is undesirable, since that capacitance would need to be driven and effectively adds to the already present $C_{LOAD}$ as indicated on FIG. 2. To assist in understanding this $C_{LOAD}$, an input stage 26 of the example DAC circuitry driven by the clock signal is shown in FIG. 2.

A design target considered by the inventors is to have a wide tuning range and low-power clock buffer 8, since it may be desirable to adjust the operating frequency of the circuit block 10 (DAC or ADC circuitry) over a relatively wide range—for example to suit a wide range of different applications. An example design requirement may be a 40-90 Gs/s ADC/DAC, equating to a 10-22.5 GHz clock rate range (a range of 2.25:1) for the quadrature sinusoidal clock signals as employed in the circuitry of EP2849345 and EP2211468.

For example, to provide the effective 2.25:1 frequency range mentioned above, this would equate to an approximate 1:5 range in either capacitance or inductance (given the square-root relationship above). If this were achieved by adding capacitance, the added capacitance would vary from 0 to 4 times $C_{LOAD}$ which would open up the possibility of having to drive a large additional capacitance leading to increased power consumption.

With the above in mind, the variable or tuneable inductor 22 is provided to enable the effective LC components associated with the clock buffer 8 and the input of the circuit block 10 (DAC/ADC) to be tuned so as to bring the resonant frequency towards the selected operating frequency (i.e., that of the clock signal). The closer these two frequencies are brought together, the better may be the overall efficiency of the circuitry 20 and indeed that of the wider circuitry 10.

Figure 3:
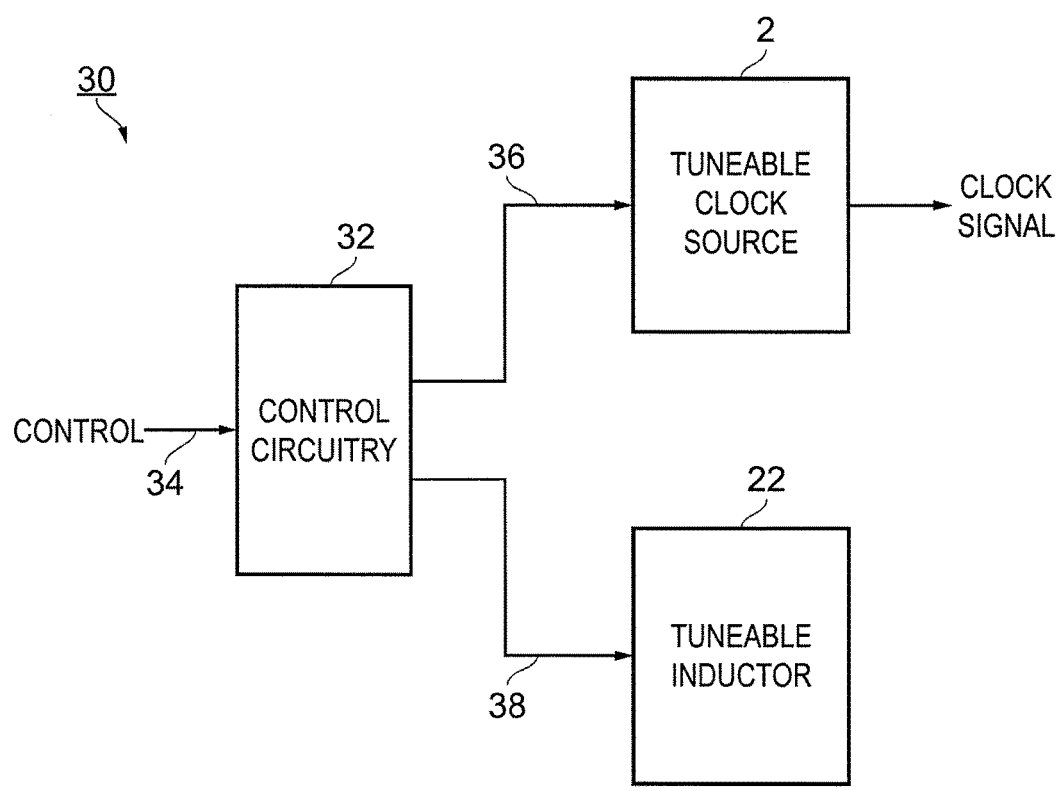
FIG. 3 is a schematic block diagram of a system embodying the present invention.

FIG. 3 is a schematic block diagram of a system 30 embodying the present invention. System 30 may be implemented in circuitry 1 and circuitry 20, and comprises control circuitry 32 along with the tuneable clock source 2 and the tuneable inductor 22.

The control circuitry 32 is connected to receive an input control signal 34 based on which control signals 36 and 38 are generated by the control circuitry 32 and output to the tuneable clock source 2 and the tuneable inductor 22.

The input control signal 34 serves to select a desired operating frequency of the circuitry 10 or 20 in which the system 30 is implemented. The control circuitry 32 is in turn configured to output control signal 36 such that the tuneable clock source 2 outputs the clock signal (or set of clock signals, as in FIG. 1) having the desired operating frequency, and to output the control signal 38 such that the tuneable inductor (or a set of such inductors, bearing in mind the set of clock signals as in FIG. 1) adopts an inductance value corresponding to the frequency of the clock signal such that the effective LC components associated with (taking circuitry 20 as an example) the clock buffer 8 and the input of the circuit block 10 (DAC/ADC) are tuned so as to bring the resonant frequency towards and as close as possible to the selected clock (operating) frequency, given the inductor values available.

Figure 4:
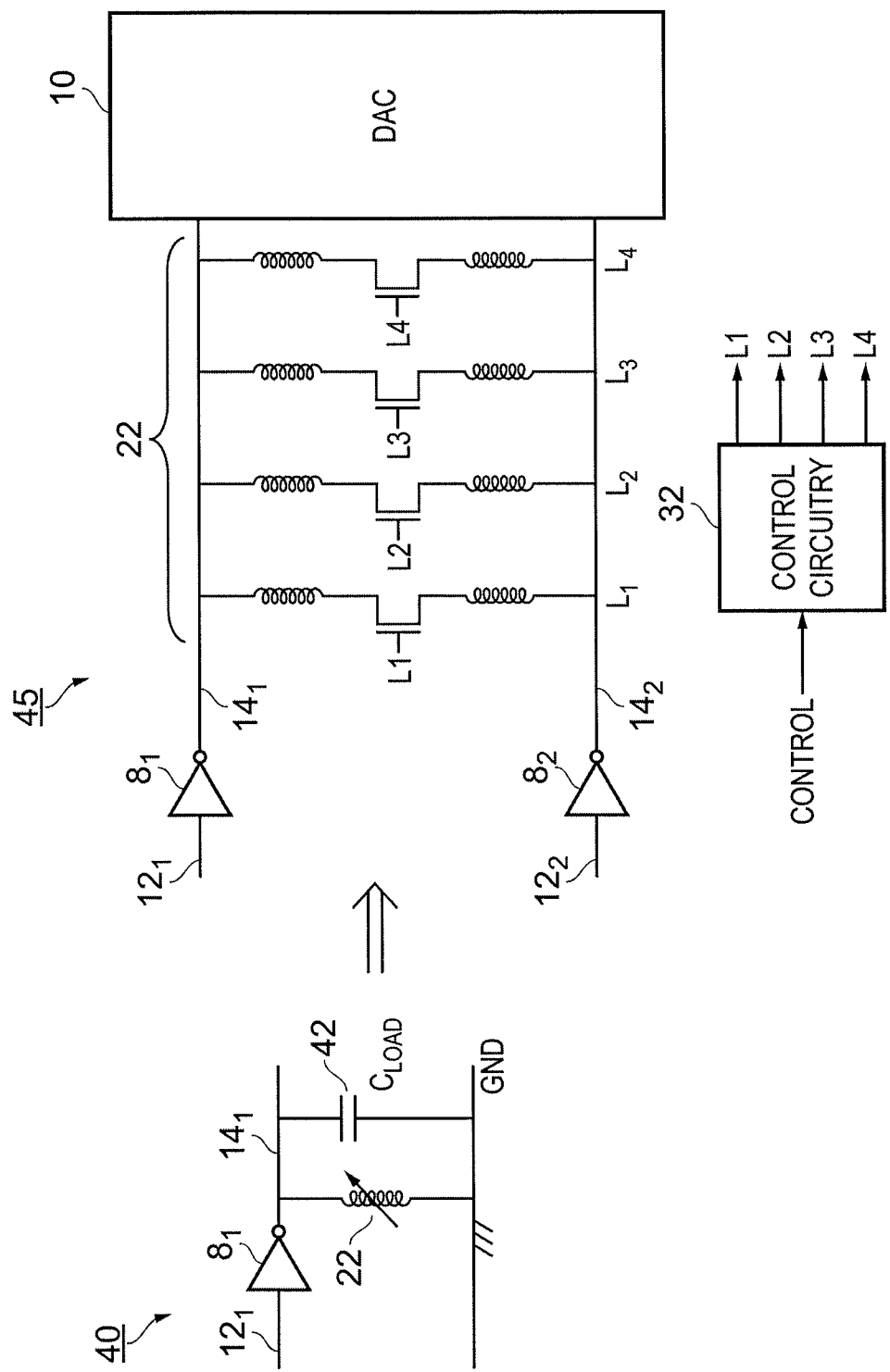
FIG. 4 is a schematic diagram of circuitry for implementing a tuneable inductor in accordance with the present invention.

FIG. 4 is a schematic diagram of circuitry 40 and 45 useful for understanding how variable inductor 22 may be implemented.

Circuitry 40 is a simplified representation of circuitry 20, for example representing the full capacitive load as a capacitor $C_{LOAD}$ 42 and with the series capacitor 24 omitted for simplicity. Circuitry 40 therefore comprises the clock buffer 8, implemented by way of example as a CMOS inverter, the tuneable inductor 22 and the capacitive load $C_{LOAD}$ 42. The clock buffer 8 receives the clock signal over signal line 12 and outputs the buffered clock signal over signal line 14 to drive the capacitive load 42. The variable inductor 22 is in this case connected between the signal line 14 and ground supply GND.

The circuitry 45 is equivalent to circuitry 40, except that two parallel clock paths are shown providing respective clock signals (of the set of quadrature clock signals) via respective clock buffers $8_1$ and $8_2$ over signal lines $12_1/14_1$ and $12_2/14_2$ to drive the circuit block 10 (serving as a capacitive load driven by those clock signals). Again, the series capacitors 24 (i.e., $24_1$ and $24_2$) are omitted for simplicity. Further, the tuneable inductor 22 is connected between the two parallel clock paths.

The variable inductor 22 is implemented in circuitry 45 as an array of inductors $L_1$ to $L_4$ which may be switched into or out of circuit by way of corresponding control signals L1 to L4 output by control circuitry 32 which is also shown. It will be appreciated that control signals L1 to L4 correspond collectively to control signal 38 of FIG. 3. Of course, although four inductors $L_1$ to $L_4$ are shown in FIG. 4, any integer number N of such inductors $L_1$ to $L_N$ could be employed, where N≥2, with corresponding control signals L1 to LN.

Thus, inductor 22 is implemented in FIG. 4 as an array of discrete (fixed inductance) inductors connected together in parallel, along with switching circuitry or means (in this case, MOSFET transistors) which can be used to switch them into or out of circuit. This provides the possibility of selecting different combinations of the discrete inductors $L_1$ to $L_4$ to provide different overall inductance values of the tuneable inductor 22.

FIG. 5 is a table presenting ten such combinations, ranging from only $L_1$ switched into circuit (combination 1) to all four inductors $L_1$ to $L_4$ switched into circuit together (combination 10). Clearly, other combinations are possible (e.g., $L_1+L_3+L_4$), however if $L_1$ to $L_4$ are sized appropriately (e.g., with $L_1$ having the smallest inductance value, $L_2$ having the next biggest inductance value and so on and so forth up to $L_4$) the ten combinations in FIG. 5 give a substantially evenly distributed range of overall inductance values between the maximum value ($L_1$ only, in combination 1) and the minimum value ($L_1$ to $L_4$ all switched into circuit, in combination 10).

For example, the relative sizing or weighting of the inductor values $L_1$ to $L_4$ (corresponding to the inductors $L_1$ to $L_4$) could be approximately 1:0.81:0.65:0.53, corresponding to $L_1:L_2:L_3:L_4$, i.e. effectively normalising the values relative to $L_1$. To get even step sizes, the first combination with two parallel inductors (i.e. combination 5: $L_1+L_2$) should give the same percentage change in inductance from the previous combination 4 (i.e. $L_4$) as $L_1$ to $L_2$ (combination 1 to 2), $L_2$ to $L_3$ (combination 2 to 3), and $L_3$ to $L_4$ (combination 3 to 4).

Figure 6:
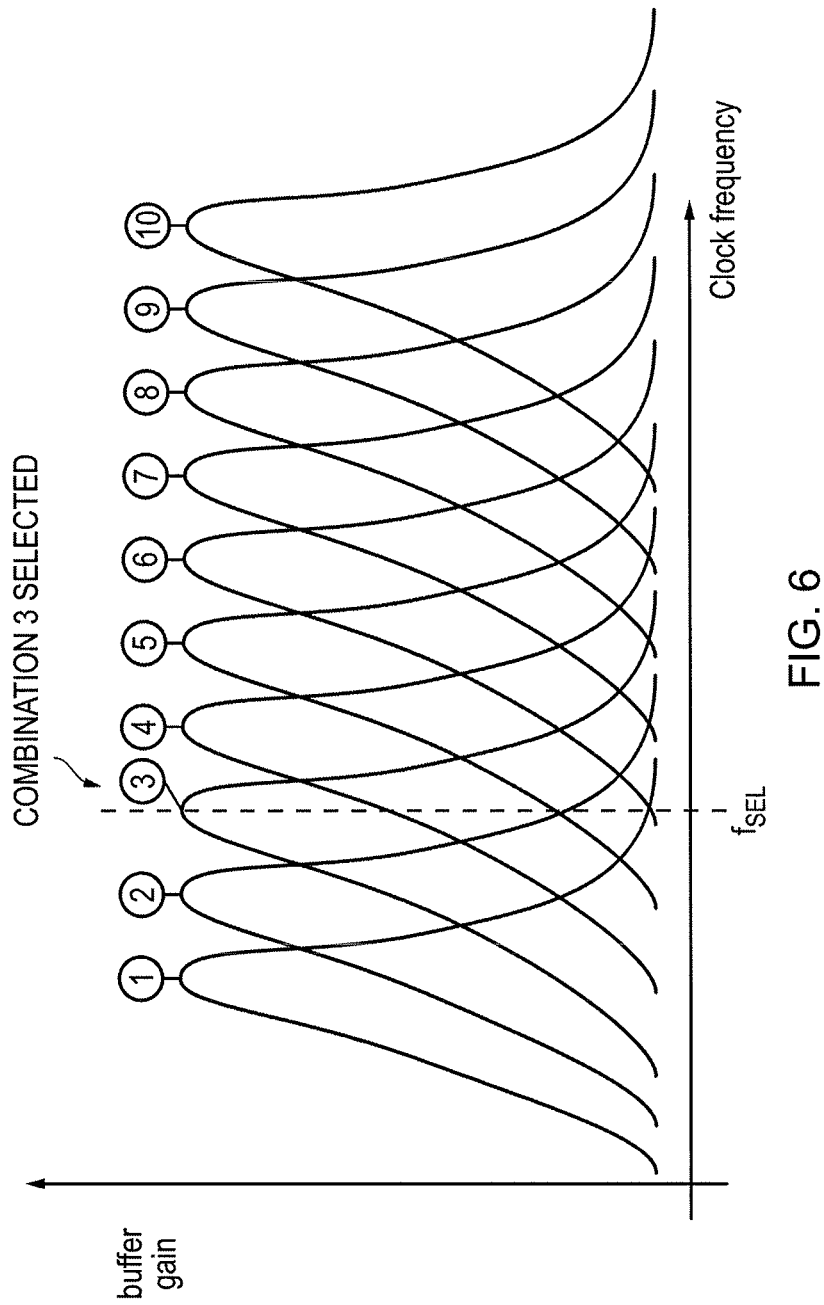
FIG. 6 is a graph of buffer gain against clock frequency.

FIG. 6 is a graph of buffer gain against clock frequency, considering for example clock buffer 8 of circuitry 20. The graph is schematic, and is simply intended to illustrate that for different combinations of discrete inductors as in FIG. 5, corresponding to different overall inductances of variable inductor 22, the buffer gain will have different profiles or traces, with its resonant frequency being reflected by the peak of the profile concerned. Thus, the ten profiles or traces in the graph of FIG. 6 may be considered to correspond respectively to the ten combinations in the table of FIG. 5, as indicated. If a given clock frequency is selected, indicated in FIG. 6 as $f_{SEL}$, it is advantageous to select the corresponding combination of discrete inductors (or, the overall inductance of the tuneable inductor 22), in this case combination 3, such that the selected clock frequency $f_{SEL}$ is as close as possible to a resonant peak of the buffer gain.

Returning now to FIG. 2, the inventors have also focussed their attention on the capacitor 24, connected in series along the clock path 16. It will be recalled that this capacitor serves to provide AC-coupling along the signal line 14 to the input of the circuit block 10. Looking back to FIG. 1, it will be appreciated that there may be multiple clock paths 16, for example four parallel clock paths 16 per set of quadrature clock signals, and, although not shown, that one circuit block 10 may require many sets of quadrature clock signals. An overall integrated circuit (e.g., on an IC chip) may also have many circuit blocks 10, each requiring many sets of quadrature clock signals. In the context of DAC or ADC circuitry as indicated in FIG. 1, this may correspond to multiple DAC or ADC channels. As such, there may be considerable complexity in implementing the clock paths.

A capacitor corresponding to capacitor 24 has the potential to take up considerable space, leading to an area, resistance, parasitic-capacitance-to-ground, and hence power cost. The area cost would also have a knock-on effect in terms of layout complexity.

Figure 7:
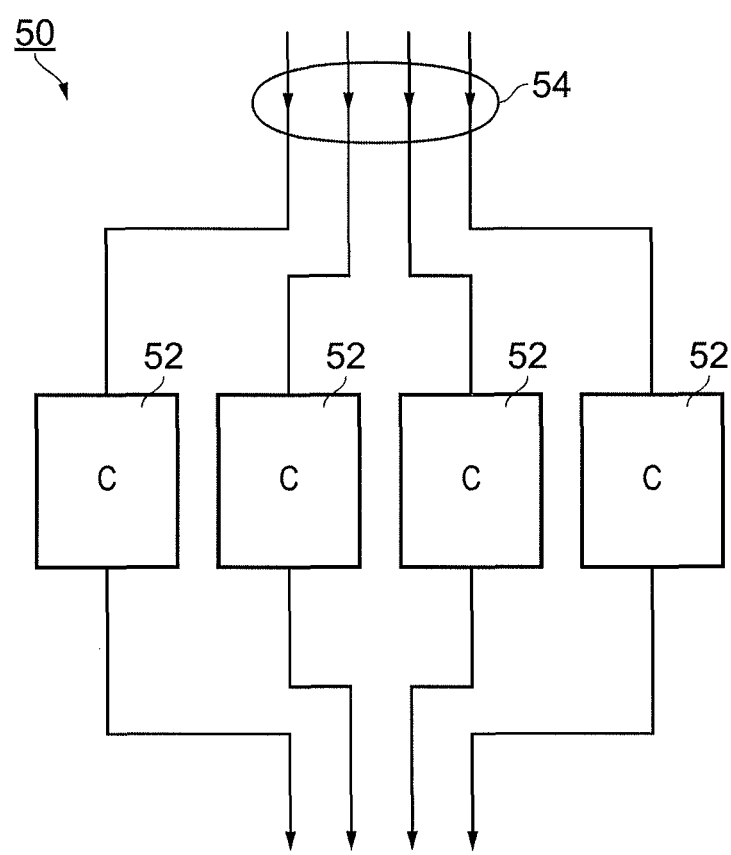
FIG. 7 is a schematic diagram of an example clock path layout.

FIG. 7 is a schematic diagram of an example layout 50, in which four such capacitors 52 are laid out in a regular array and a set of quadrature clock signals are routed via those capacitors 52 along corresponding clock paths 54 made up of signal lines (transmission lines). As can be appreciated from FIG. 7, at the point where the clock paths 54 pass via the capacitors 52 the area taken up by the clock path arrangement is considerably increased compared to the portions before and after the capacitors 52. Also, the layout indicated in FIG. 7 simply for example may be undesirable given that the lengths of signal line per path are different, since this could lead to phase errors between the quadrature clock signals carried over those paths.

Figure 8:
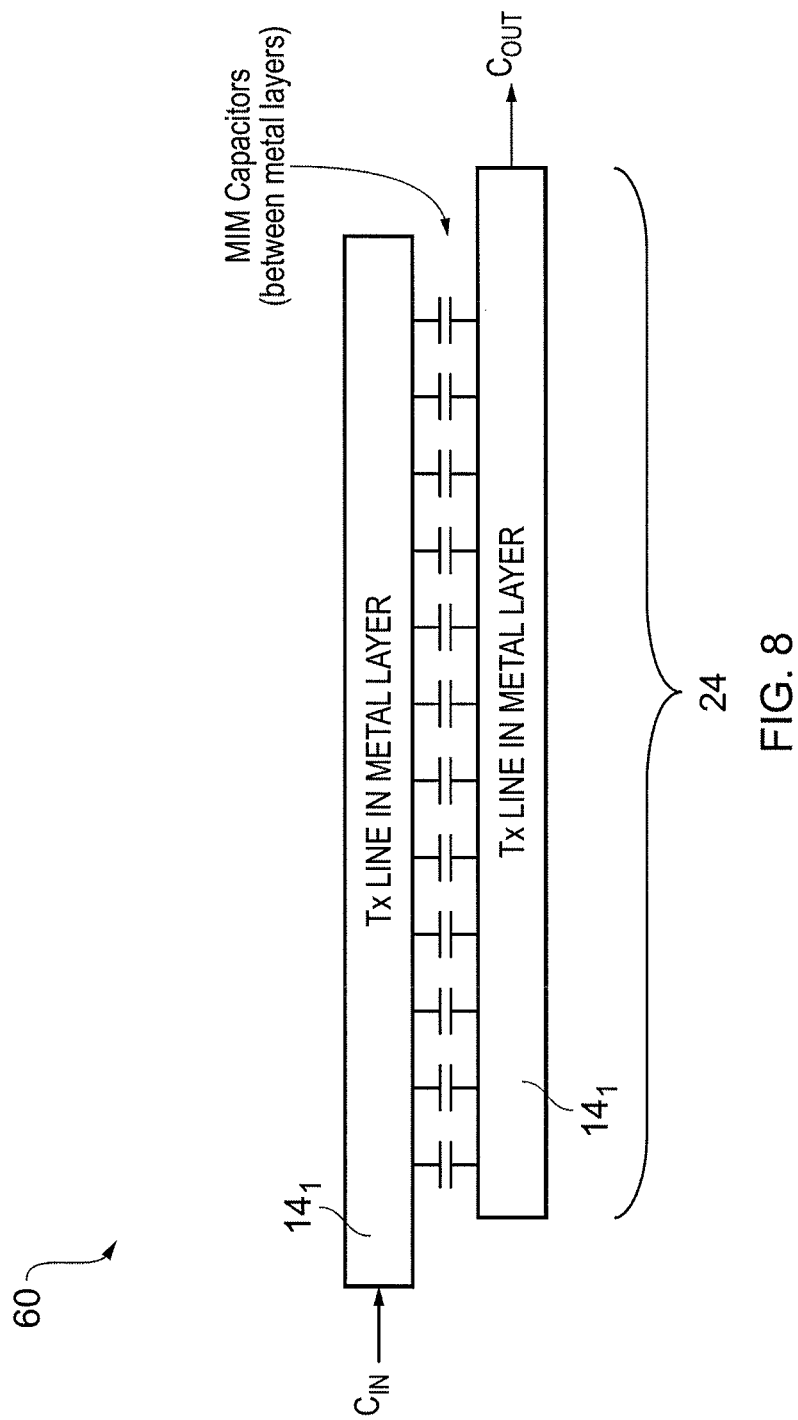
FIG. 8 is a schematic diagram of a capacitor implementation in accordance with the present invention.

FIG. 8 is a schematic diagram of an implementation 60 of capacitor 24. The general idea is to implement the clock signal lines as transmission lines in the metal layers (e.g., in one or more of metal layers M10 and M11 of a layer structure as described below in connection with FIG. 9), and to implement the AC-coupling capacitor 24 as a distributed MIM (Metal-Insulator-Metal) capacitor between adjacent metal layers (i.e., between the transmission lines). As such, one or more MIM capacitors may together make up the capacitor 24.

Figure 9:
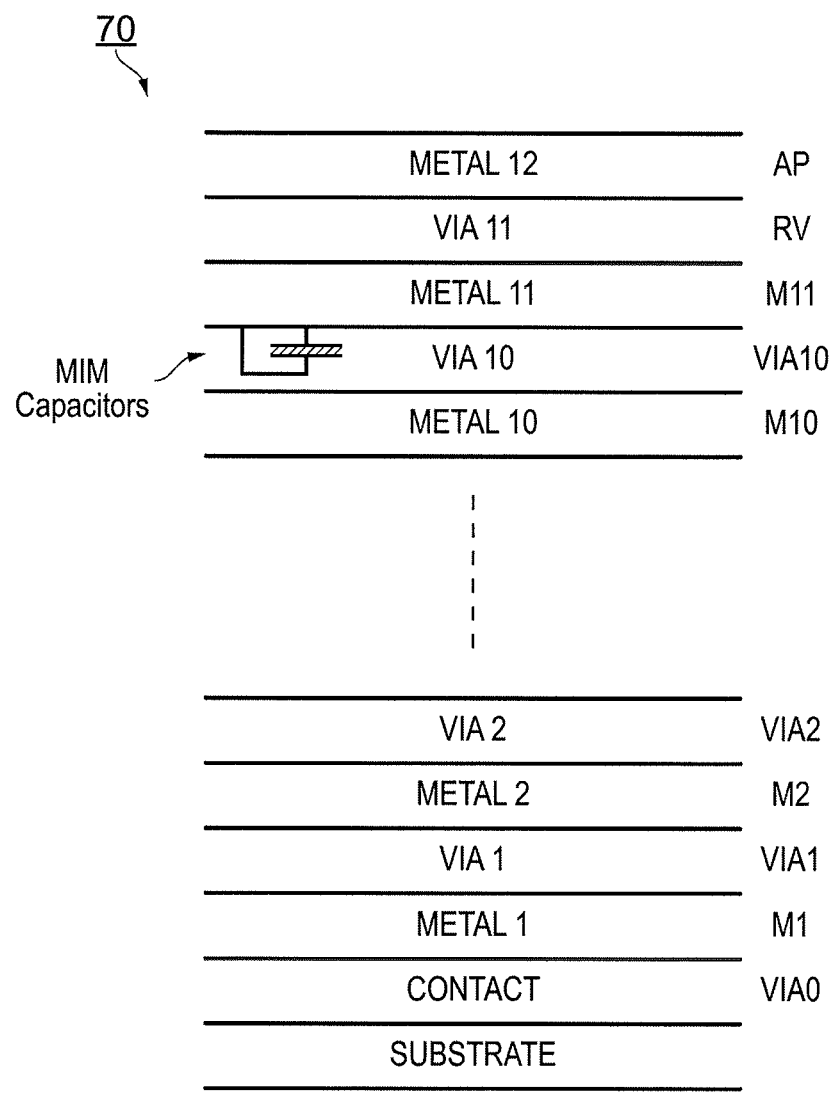
FIG. 9 is a schematic diagram of an example integrated-circuitry layer structure useful for understanding embodiments of the present invention.

FIG. 9 is a schematic diagram of an example layer structure 70 which may be adopted when implementing integrated circuits embodying the present invention. A substrate layer is provided at the bottom, followed by a contact layer (VIA0) and then alternating metal (e.g. M1) and via (e.g. VIA1) layers as indicated.

The indications "AP" and "RV" are simply labels corresponding to an example implementation. The label AP indicates that the top metal layer may be an aluminium layer (whereas the lower layers may be copper layers) and used for connection pads (hence AP) and the connections to them. The via layer to this "redistribution layer" is labelled RV.

Signal lines may be implemented in the metal layers (e.g., in layers M10 and M11), with connections between the layers being made by vias implemented in the via layers (e.g., in layer VIA10). In the present example, MIM capacitors may be implemented in the via layer VIA10 as indicated, although this is of course only an example. Also, although it is suggested in FIG. 9 that both terminals of the MIM capacitors are connected to the same metal layer, in this case metal layer M11, this is only an example. The terminals of a MIM capacitor may connect respectively to the two adjacent metal layers, in this case metal layers M10 and M11.

Figure 10:
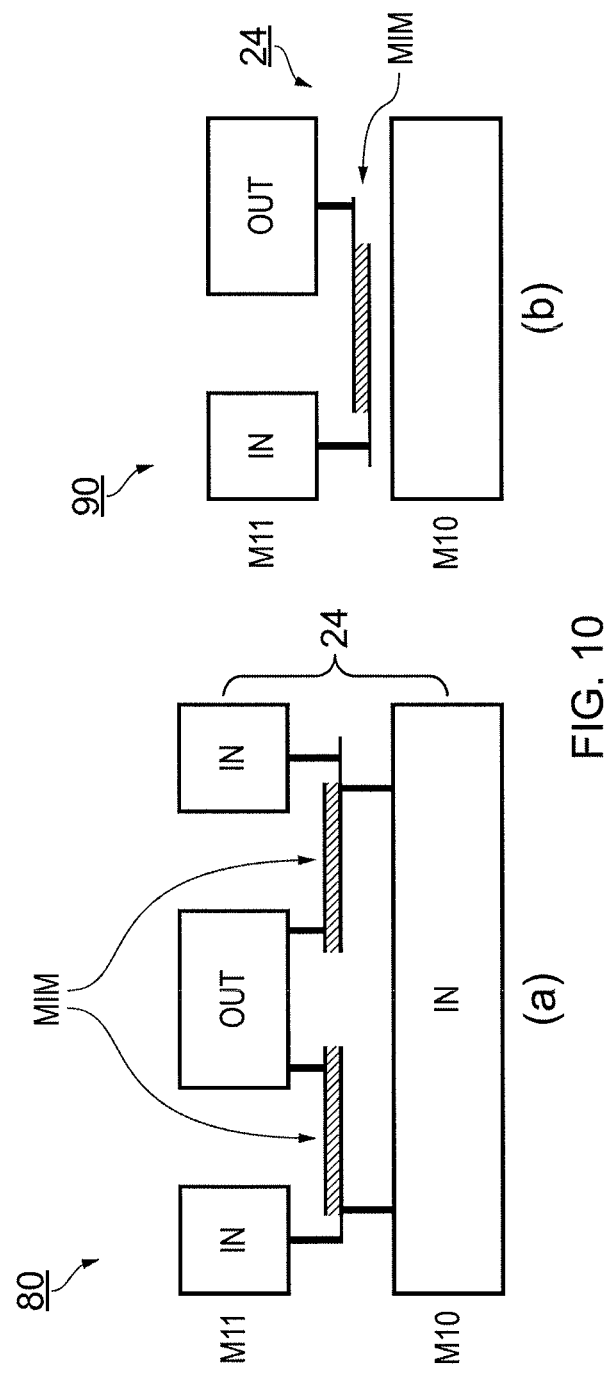
FIG. 10 is a schematic diagram indicating two possible capacitor implementations in accordance with the present invention.

FIG. 10 is a schematic diagram indicating two possible implementations 80 and 90 of capacitor 24 in cross-section, i.e. with the clock-signal transmission lines running into and out of the page. Other implementations are of course possible.

In implementation 80 of FIG. 10(a), the "IN" and "OUT" signal lines of the capacitor 24 (see $C_{IN}$ and $C_{OUT}$ in FIG. 8) are implemented in adjacent metal layers M10 and M11, with the "IN" path being partly in both layers. The MIM capacitors, together making up the AC coupling capacitor 24, are implemented between layers M10 and M11.

In implementation 90 of FIG. 10(b), the "IN" and "OUT" signal lines are both implemented in metal layer M11. The MIM capacitors (only one is shown—multiple such capacitors could be provided for example along the signal lines in the dimension passing into and out of the page), together making up the AC coupling capacitor 24, are implemented between layers M10 and M11.

Because the MIM capacitors are implemented between the metal layers and effectively alongside (over or under) the clock signal lines which are needed in any event, there is no area penalty in providing the MIM capacitors. Also, the MIM capacitors do not create any additional parasitic capacitance to ground (e.g., to the substrate as shown in FIG. 9), because they are effectively shielded by the metal layers in the layer structure. What little parasitic capacitance they add appears effectively between the metal layers and thus in parallel with the desired AC coupling capacitor 24, rather than between that capacitor and ground as might otherwise be expected. The parasitic capacitance can then be designed into the sizing of the MIM capacitors, as it is effectively "free" capacitance.

With no additional parasitic capacitance to ground (which would need driving) there is no related power cost. Thus, the AC coupling capacitor can be made as big as possible, with little or no area/power cost or added parasitic capacitance to ground, and with low resistance because the capacitor is distributed (i.e., effectively very "short and wide" so that the resistance of the MIM capacitor plates is very low).

Also, the addition of the MIM capacitors does not impact greatly on the design layout for the clock signal paths, since they run alongside (over or under) those paths, simplifying the complexity and therefore reducing the burden at the design stage. Thus, looking back to FIG. 7 for example, the clock paths carrying the example set of quadrature clock signals may be routed along clock paths corresponding to those shown before and after the capacitors 52, i.e. without needing to take up extra area to accommodate the capacitors 52 and the associated layout complexities.

It will be appreciated that embodiments of the present invention may be implemented as integrated circuitry, for example as an IC chip. Such circuitry may comprise mixed-signal circuitry such as DAC or ADC circuitry in line with FIG. 1, and be referred to as mixed-signal, DAC or ADC circuitry.

The present invention extends to integrated circuitry and IC chips (such as flip chips) as mentioned above, circuit boards comprising such IC chips, and communication networks (for example, internet fiber-optic networks and wireless networks) and network equipment of such networks, comprising such circuit boards.

The present invention may be embodied in many different ways in the light of the above disclosure, within the spirit and scope of the appended claims.

The invention claimed is:

1. Integrated circuitry, comprising:
a clock path for carrying a clock signal from a clock source to a circuit block, the circuit block being operable based on said clock signal; and
an AC coupling capacitor connected in series along the clock path,
wherein:
the integrated circuitry has a layered structure comprising a plurality of metal layers and one or more via layers sandwiched between adjacent said metal layers;
the clock path is implemented in at least one of said metal layers; and
the AC coupling capacitor is implemented in a said via layer,
wherein portions of the clock path are implemented over one another in an overlapped configuration, and wherein the AC coupling capacitor is provided between the overlapped portions,
and wherein the coupling capacitor is distributed along a length of the overlapped portions.

2. The integrated circuitry of claim 1, wherein:
the clock path is implemented across adjacent said metal layers, and wherein the AC coupling capacitor is implemented in a said via layer between two adjacent said metal layers across which the clock path is implemented; or
the clock path is implemented in a single said metal layer and wherein the AC coupling capacitor is implemented in a said via layer adjacent to that metal layer.

3. The integrated circuitry of claim 1, wherein the AC coupling capacitor comprises a dielectric sandwiched between outer plates, and wherein said dielectric outer plates are implemented in the same via layer.

4. The integrated circuitry of claim 1, wherein the AC coupling capacitor underlies or overlies part of the clock path so as not to take up, additional area either side of the clock path in said layers.

5. The integrated circuitry of claim 1, comprising a plurality of said clock paths having respective said AC coupling capacitors connected therealong in series.

6. Digital-to-analogue converter circuitry or analogue-to-digital converter circuitry or an IC chip, comprising the integrated circuitry of claim 1.

7. The integrated circuitry of claim 1, further comprising:
clock buffer circuitry provided along said clock path for buffering said clock signal; and
a tuneable inductance connected to said clock path.

8. The integrated circuitry of claim 7, wherein the tuneable inductance comprises an array of inductors and switching circuitry configured to switch the inductors into or out of circuit based upon a control signal.

9. The integrated circuitry of claim 8, wherein the inductors of the array have mutually different inductance values.

10. The integrated circuitry of claim 8 wherein:
the array has N inductors $L_1$ to $L_N$, where N is an integer greater than 1;
the inductors have respective inductance values $L_1$ to $L_N$; and
the inductance values are set such that different combinations of those inductors provide a range of different overall inductance values of said tuneable inductance, each said combination comprising at least one of those inductors switched into circuit and up to N−1 of those inductors switched out of circuit.

11. The integrated circuitry of claim 10, wherein:
said range of different, overall inductance values includes a maximum overall inductance value $L_{MAX}$ and a minimum overall inductance value $L_{MIN}$, and
the inductance values $L_1$ to $L_N$ are set such that said different overall inductance values are substantially evenly distributed from $L_{MAX}$ to $L_{MIN}$.

12. The integrated circuitry of claim 7, further comprising:
a tuneable clock source configured to generate said clock signal; and
control circuitry operable to control the tuneable clock source such that said clock signal has a desired clock frequency and to control the tuneable inductance such that its inductance value has a desired value for causing resonant or near-resonant transmission of the clock signal to the circuit block.

13. The integrated circuitry of claim 12, wherein the tuneable clock source comprises a plurality of tuneable clock-signal generators, each configured to generate a clock signal having a clock frequency over its own frequency range, and circuitry for selecting and outputting the clock signal generated by one of those clock-signal generators.

* * * * *